(12) United States Patent
Wei et al.

(10) Patent No.: US 8,860,181 B2
(45) Date of Patent: Oct. 14, 2014

(54) THIN FILM RESISTOR STRUCTURE

(75) Inventors: Ming-Te Wei, Changhua County (TW);
Po-Chao Tsao, New Taipei (TW);
Chen-Hua Tsai, Hsinchu County (TW);
Chien-Yang Chen, Kaohsiung (TW);
Chia-Jui Liang, Tainan (TW);
Ming-Tsung Chen, Tainan (TW)

(73) Assignee: United Microelectronics Corp.,
Science-Based Industrial Park, Hsin-Chu
(TW)

( * ) Notice: Subject to any disclaimer, the term of this
patent is extended or adjusted under 35
U.S.C. 154(b) by 75 days.

(21) Appl. No.: 13/413,669

(22) Filed: Mar. 7, 2012

(65) Prior Publication Data

US 2013/0234292 A1   Sep. 12, 2013

(51) Int. Cl.
*H01L 29/00* (2006.01)
(52) U.S. Cl.
USPC ........... 257/536; 257/585; 257/750; 438/622; 438/686
(58) Field of Classification Search
USPC .......... 257/536, 585, 750, E21.579; 438/662, 438/686, 782
See application file for complete search history.

(56) References Cited

U.S. PATENT DOCUMENTS

| | | |
|---|---|---|
| 5,030,588 A | 7/1991 | Hosaka |
| 5,128,745 A | 7/1992 | Takasu |
| 5,892,282 A | 4/1999 | Hong |
| 6,033,963 A | 3/2000 | Huang |
| 6,066,533 A | 5/2000 | Yu |
| 6,096,659 A | 8/2000 | Gardner |
| 6,177,303 B1 | 1/2001 | Schmitz |
| 6,303,418 B1 | 10/2001 | Cha |
| 6,458,684 B1 | 10/2002 | Guo |
| 6,492,217 B1 | 12/2002 | Bai |
| 6,552,377 B1 | 4/2003 | Yu |
| 6,573,134 B2 | 6/2003 | Ma |
| 6,653,698 B2 | 11/2003 | Lee |
| 6,696,345 B2 | 2/2004 | Chau |
| 6,790,719 B1 | 9/2004 | Adetutu |
| 6,794,234 B2 | 9/2004 | Polishchuk |
| 6,858,483 B2 | 2/2005 | Doczy |
| 6,872,655 B2 | 3/2005 | Mahalingam |
| 6,902,969 B2 | 6/2005 | Adetutu |
| 6,921,711 B2 | 7/2005 | Cabral, Jr. |
| 6,953,719 B2 | 10/2005 | Doczy |
| 6,960,416 B2 | 11/2005 | Mui |
| 6,967,131 B2 | 11/2005 | Saenger |
| 6,972,225 B2 | 12/2005 | Doczy |
| 7,029,966 B2 | 4/2006 | Amos |
| 7,030,430 B2 | 4/2006 | Doczy |
| 7,056,794 B2 | 6/2006 | Ku |
| 7,064,050 B2 | 6/2006 | Cabral, Jr. |
| 7,064,066 B1 | 6/2006 | Metz |
| 7,074,664 B1 | 7/2006 | White |
| 7,074,680 B2 | 7/2006 | Doczy |

(Continued)

*Primary Examiner* — Phuc Dang
(74) *Attorney, Agent, or Firm* — Winston Hsu; Scott Margo

(57) ABSTRACT

A thin film resistor structure includes a substrate, a flat bottom ILD (inter layer dielectric) disposed on the substrate, a plurality of first contacts disposed in the bottom ILD, and each top surface of the first contacts is on the same level as a top surface of the bottom ILD; a flat top ILD disposed on the bottom ILD, a plurality of second contacts disposed in the top ILD, and each top surface of the second contacts is on the same level as a top surface of the top ILD, and a thin film resistor disposed between the bottom ILD and the top ILD.

15 Claims, 7 Drawing Sheets

(56) References Cited

U.S. PATENT DOCUMENTS

| | | |
|---|---|---|
| 7,109,079 B2 | 9/2006 | Schaeffer, III |
| 7,112,851 B2 | 9/2006 | Saenger |
| 7,126,199 B2 | 10/2006 | Doczy |
| 7,144,783 B2 | 12/2006 | Datta |
| 7,148,548 B2 | 12/2006 | Doczy |
| 7,153,734 B2 | 12/2006 | Brask |
| 7,153,784 B2 | 12/2006 | Brask |
| 7,157,378 B2 | 1/2007 | Brask |
| 7,176,090 B2 | 2/2007 | Brask |
| 7,183,184 B2 | 2/2007 | Doczy |
| 7,186,605 B2 | 3/2007 | Cheng |
| 7,193,893 B2 | 3/2007 | Forbes |
| 7,208,361 B2 | 4/2007 | Shah |
| 7,208,366 B2 | 4/2007 | Tsai |
| 7,217,611 B2 | 5/2007 | Kavalieros |
| 7,220,635 B2 | 5/2007 | Brask |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,381,619 B2 | 6/2008 | Wang |
| 7,390,709 B2 | 6/2008 | Doczy |
| 7,407,876 B2 | 8/2008 | Ishizaka |
| 7,488,656 B2 | 2/2009 | Cartier |
| 7,556,998 B2 | 7/2009 | Park |
| 7,696,086 B2 * | 4/2010 | Hsu et al. ............... 438/633 |
| 7,700,479 B2 | 4/2010 | Huang |
| 7,785,958 B2 | 8/2010 | Doczy |
| 2001/0017397 A1 * | 8/2001 | Lee ............... 257/536 |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0024953 A1 | 2/2006 | Papa Rao |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0117327 A1 * | 5/2007 | Lee et al. ............... 438/266 |
| 2007/0138559 A1 | 6/2007 | Bohr |
| 2007/0145591 A1 | 6/2007 | Yano |
| 2007/0148838 A1 | 6/2007 | Doris |
| 2007/0210354 A1 | 9/2007 | Nabatame |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2008/0318371 A1 | 12/2008 | Lin |
| 2009/0039433 A1 | 2/2009 | Yang |
| 2009/0057769 A1 | 3/2009 | Wei |
| 2009/0057787 A1 | 3/2009 | Matsuki |
| 2009/0166769 A1 | 7/2009 | Metz |
| 2009/0166849 A1 * | 7/2009 | Jao et al. ............... 257/700 |
| 2009/0186458 A1 | 7/2009 | Yu |
| 2010/0044783 A1 | 2/2010 | Chuang |
| 2010/0052066 A1 | 3/2010 | Yu |
| 2010/0052074 A1 | 3/2010 | Lin |
| 2010/0065926 A1 | 3/2010 | Yeh |
| 2010/0068877 A1 | 3/2010 | Yeh |
| 2010/0081262 A1 | 4/2010 | Lim |
| 2010/0087055 A1 | 4/2010 | Lai |
| 2010/0124818 A1 | 5/2010 | Lee |
| 2010/0244141 A1 | 9/2010 | Beyer |
| 2011/0006437 A1 * | 1/2011 | Tsao et al. ............... 257/774 |
| 2012/0241868 A1 * | 9/2012 | Tsai et al. ............... 257/369 |

* cited by examiner

THIN FILM RESISTOR STRUCTURE

BACKGROUND OF THE INVENTION

1. Field of the Invention

The present invention relates to a thin film resistor structure, and more particularly, to a thin film resistor structure integrated with a metal gate structure.

2. Description of the Prior Art

In the field of semiconductor fabrication, polysilicon material has been conventionally used to form the gates of metal-Oxide-Semiconductor Field-Effect (MOSFET) transistors. However, polysilicon materials have some drawbacks: the resistance of a polysilicon gate is higher than most of any metal materials, and the conductivity rate of the polysilicon gate is therefore lower than metal wires. In order to compensate for this disadvantage, the polysilicon gate usually undergoes a silicide process to simultaneously reduce the contact resistance and the parasitic resistance ($R_p$), so that the conductivity rate of the polysilicon gate is improved to an acceptable range.

It is worth noting that the polysilicon is used not only to form the gates, but also to form passive devices for mixed-mode integrated circuit devices, such as capacitors, or thin film resistors, etc. It is also well-known that the resistance of a thin film resistor made of polysilicon can be adjusted by modifying factors such as temperature or pressure during the polysilicon deposition process, or by adjusting the area, the thickness, or the concentration of implanted dopants in the polysilicon layer.

Nevertheless, in the trend to replace the polysilicon gates with metal gates, those integrated passive devices that used to be made of polysilicon are also replaced with metal materials ones. Similarly to the formation process of the active devices, passive devices such as thin film resistor are fabricated by integrating the formation of the metal layer and the dielectric layer, the photolithography process, and the etching process. It is conceivable that the integration of the metal thin film resistor process and the metal gate process, particularly a gate-first process, is more complicated, and the control of the thickness and composition of the materials in use is more difficult.

Therefore looking for a way to integrate the metal gate and the thin film resistor without increasing the process complexity and costs for such strict requirements has become an important study in this field.

SUMMARY OF THE INVENTION

A thin film resistor integrated with a metal gate structure is provided for the present invention.

According to one preferred embodiment of the present invention, a thin film resistor structure is provided, comprising a substrate, a flat bottom ILD (inter layer dielectric) disposed on the substrate, a plurality of first contacts disposed in the bottom ILD, wherein each top surface of the first contacts is on the same level as a top surface of the bottom ILD, a flat top ILD disposed on the bottom ILD, a plurality of second contacts disposed in the top ILD, wherein each top surface of the second contacts is on the same level as a top surface of the top ILD, and a thin film resistor disposed between the bottom ILD and the top ILD.

The present invention further provides a thin film resistor structure comprising a substrate, a flat bottom ILD disposed on the substrate, a plurality of first contacts disposed in the bottom ILD, wherein each top surface of the first contacts is on the same level as a top surface of the bottom ILD, a flat top ILD disposed on the bottom ILD, a plurality of second contacts disposed in the top ILD, wherein each top surface of the second contacts is on the same level as a top surface of the top ILD, a thin film resistor disposed between the bottom ILD and the top ILD; and at least a supporting material disposed under the thin film resistor within the bottom ILD.

To summarize the above descriptions, the present invention provides a thin film resistor structure with a simplified manufacturing process compared to the conventional polysilicon resistor. Besides, the thin film resistor is disposed between two ILD (inter layer dielectric). The structure can be integrated with a high-k metal gate process, and doesn't need complicated additional processes.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Figure 1:
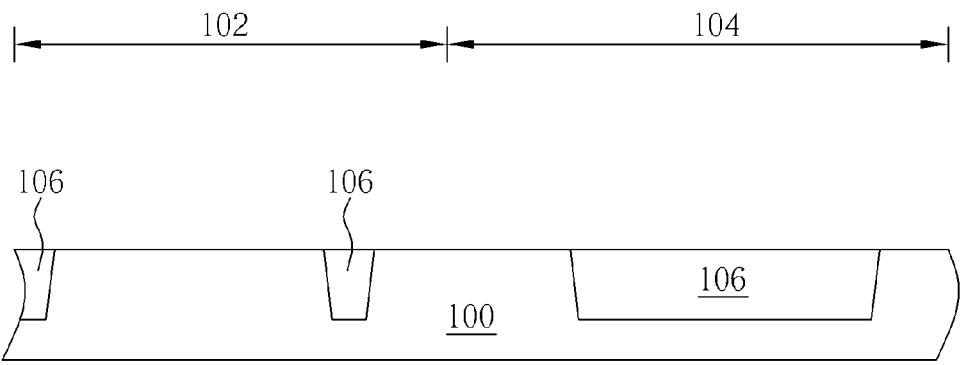
FIGS. 1-5 are schematic diagrams illustrating a thin film resistor structure according to a first preferred embodiment of the present invention.

Please refer to FIG. 1-5, FIGS. 1-5 are schematic diagrams illustrating a thin film resistor structure according to the first preferred embodiment of the present invention. Please note that the figures are only for illustration and may not be to scale. The scale may be further modified according to different design considerations. At first, as shown in FIG. 1, a substrate 100 is provided, a semiconductor region 102 and a resistor region 104 are on the substrate 100, and a plurality of STI (shallow trench isolation) 106 is then formed on the substrate 100 within the semiconductor region 102 and the resistor region 104. The substrate 100 may be a semiconductor substrate such as silicon substrate, epitaxial silicon substrate, silicon germanium substrate, silicon carbide substrate or silicon-on-insulator (SOI).

Figure 2:
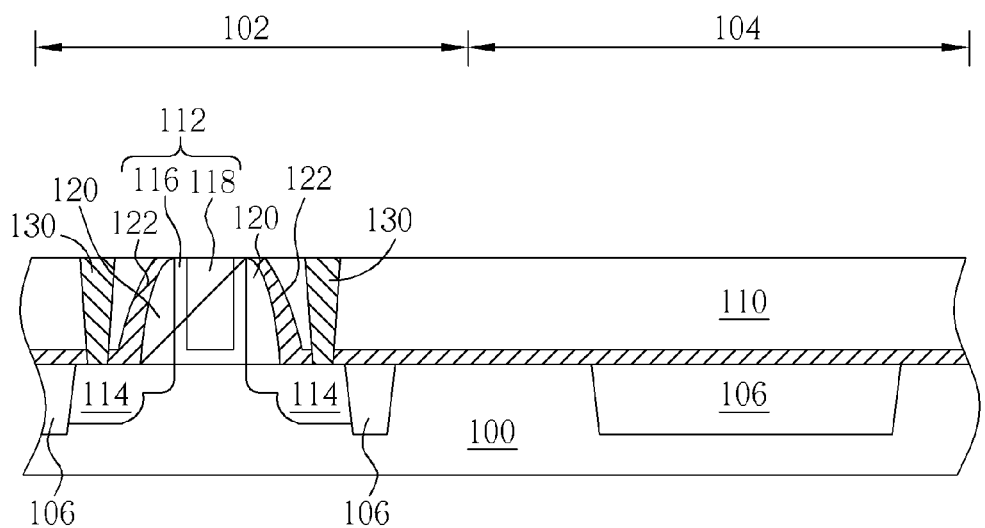

A polysilicon gate (not shown) is formed within the semiconductor region 102 as a dummy gate, and after a light doped drain (LDD), a spacer, a source/drain and a dielectric layer are formed, the polysilicon gate is replaced with a metal gate by a gate replacement process and a contact plug process. A bottom ILD (inter layer dielectric) 110 is entirely formed on the substrate 100 by a planarization process such as CMP (chemical mechanical polishing). After that, a plurality of first contacts 130 is formed in the bottom ILD 110 within the semiconductor region 102. Up to present step, as shown in FIG. 2, the semiconductor region 102 comprises at least a metal gate structure 112, and a top surface of the metal gate 112 is on the same level as a top surface of the bottom ILD 110, each top surface of the first contacts 130 is also on the same level as the top surface of the bottom ILD 110, wherein the type of the first contact 130 is not limited, it may be a pole contact or a slot contact.

The metal gate 112 includes a high-k layer 116 and at least a metal layer 118, wherein the high-k layer 116 is disposed between the substrate 100 and the metal layer 118, it may selected from a group comprising hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZrxTi_1$-$xO_3$, PZT) and barium strontium titanate ($BaxSr_1$—$XTiO_3$, BST). The metal layer 118 may be adjusted according to the metal gate 112 for PMOS or NMOS use, each of them having specific bottom barriers, work function layer, top barriers and main conductive layer. Moreover, the first contact 130 may be formed during the gate replacement process simultaneously, so that the first contact 130 and the metal gate 112 have the same materials in the work function layer and the main conductive layer, such as aluminum (Al), tungsten (W), copper (Cu), titanium aluminide (TiAl), titanium (Ti), titanium nitride (TiN), tantalum (Ta), Tantalum nitride (TaN) and titanium aluminum oxide (TiAlO). Besides, the spacer 120 may be a single layer structure or a multilayer structure formed by materials such as silicon nitride or silicon oxide, and at least a first doping region 114 formed in the substrate 100 at least one side of the metal gate 112, the doping region 114 may includes an epitaxial layer such as a silicon germanium epitaxial layer or a silicon carbide epitaxial layer, and a metal silicide (not shown) may be further formed on the doping region 114 to improve the contact performances. In addition, a CESL (contact etch stop layer, CESL) 122 may be formed between the substrate 100 and the bottom ILD 110.

It is worth noting that the embodiment is described with a high-k gate last process, but not limited thereto, the present invention may also use a high-k first gate last process, a high-k gate first process or a polysilicon gate process, and the related technologies are well known by users skilled in the technology, not redundantly described here.

Figure 3:
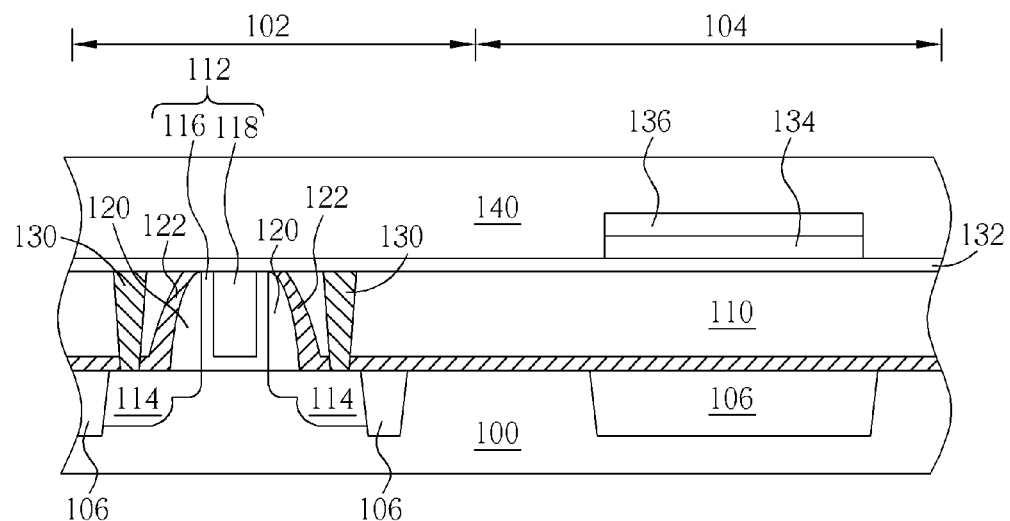

Afterwards, as shown in FIG. 3, a second stop layer 132, a thin film resistor material layer (not shown) and a protective material layer (not shown) are entirely formed on the bottom ILD 110 sequentially, the thin film resistor material layer and the protect material layer are etched simultaneously by a photo-etching process to form a thin film resistor layer 134 and a protective layer 136. Since the thin film resistor material layer and the protective material layer are patterned and etched simultaneously, the area of the thin film resistor layer 134 is equal to the area of the protective layer 136, and each sidewall of the protective layer 136 is trimmed with each sidewall of the thin film resistor layer 134. Besides, the second stop layer 132 may be a nitrogen doped carbide (NDC) adapted to protect the elements while performing etching process. The thin film resistor layer 134 may be a barrier material such as TiN or TaN, the protective layer 136 may be a SiN to protect the thin film resistor layer 134 from humidity and oxygen.

Figure 4:
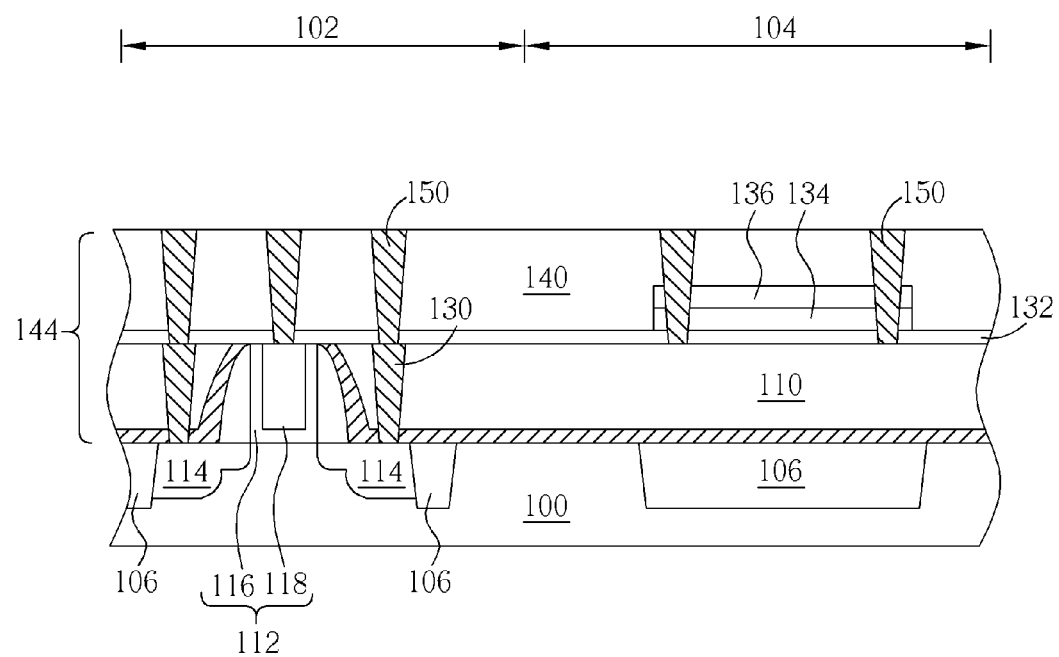

As shown in FIG. 4, a flat top ILD 140 is formed on the bottom ILD, which covers the protective layer 136. A plurality of second contacts 150 is then formed in the top ILD 140 within the semiconductor region 102 and the resistor region 104. It is worth noting that each second contact 150 within the resistor region 104 penetrates the protect layer 136 and the thin film resistor layer 134 so as to touch a surface of the second stop layer 132; and each second contact 150 within the semiconductor region 102 penetrates the second stop layer 132 and is electrically connected to the metal gate 112 or the first contacts 130. Each surface of the second contacts 150 is on the same level as surfaces of the top ILD 140. The thin film resistor layer 134 is disposed between the bottom ILD 110 and the top ILD 140, the bottom ILD 110 and the top ILD 140 may be a $SiO_2$ layer, forming a dielectric layer 144.

Figure 5:
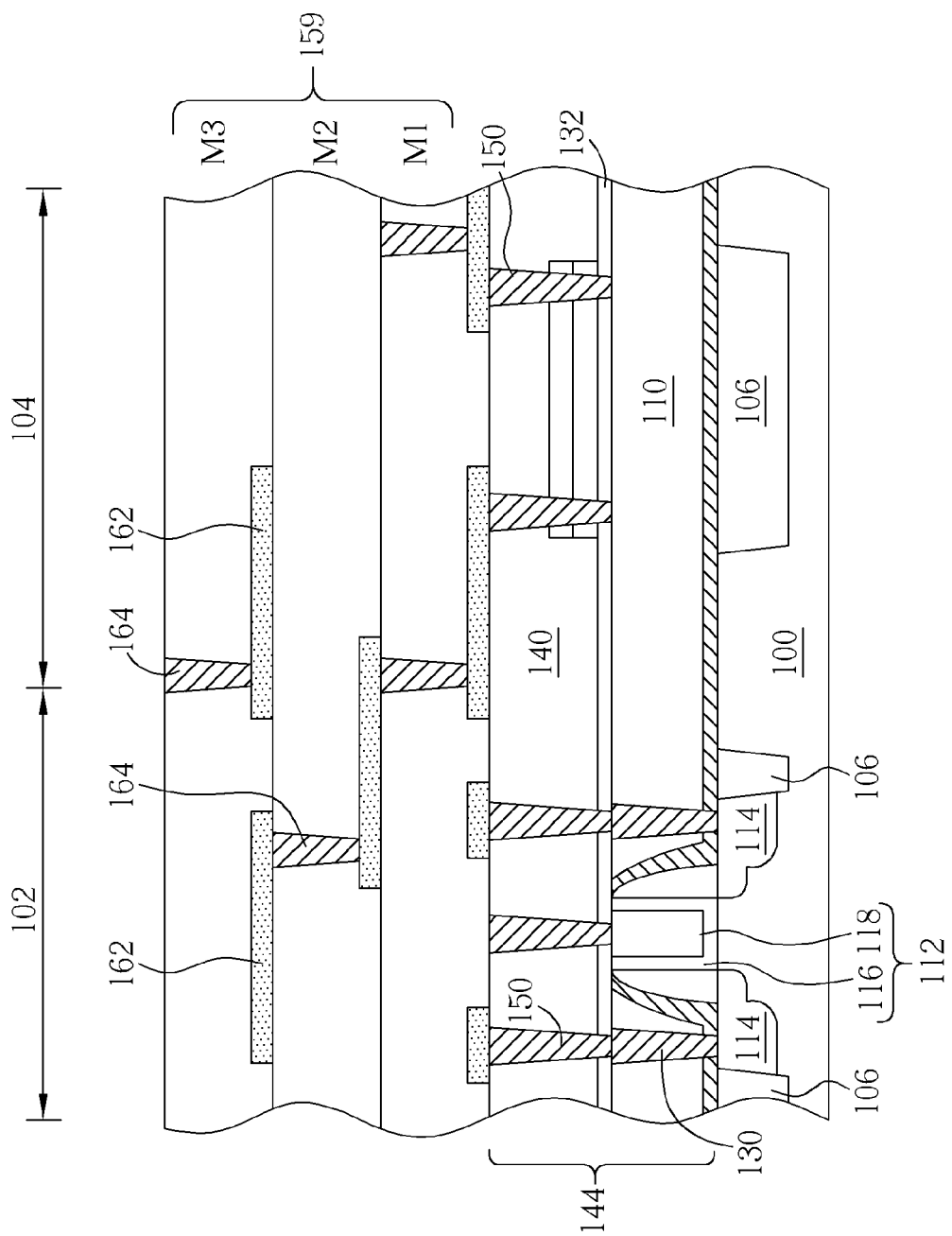

As shown in FIG. 5, after the top ILD 140 and the bottom ILD 110 are formed, an interconnection layer may be formed on the dielectric layer 144, such as an IMD (inter metal dielectric) 159 wherein the IMD 159 further comprises at least a metal trace 162 formed by copper or aluminum, such as a first metal layer (M1), a second metal layer (M2), a third metal layer (M3) ... an $n^{th}$ metal layer (Mn) and a via plug 164 in the IMD 159 to electrically connect the thin film resistor structure to other semiconductor elements. It is worth noting that the film resistor layer 134 is disposed between the top ILD 140 and the bottom ILD 110, namely disposed in the dielectric layer 144, and unlike the conventional technology, the dielectric layer 144 is the $0^{th}$ metal layer ($M_0$).

The following description will describe the different embodiments of the thin film transistor device and the manufacturing method of the present invention. To simplify the description, the following description will focus on the dissimilarities among the different embodiments and the identical features will not be redundantly described. For making it easier to compare the differences between the embodiments, the identical components in each of the following embodiments are marked with identical symbols.

Figure 6:
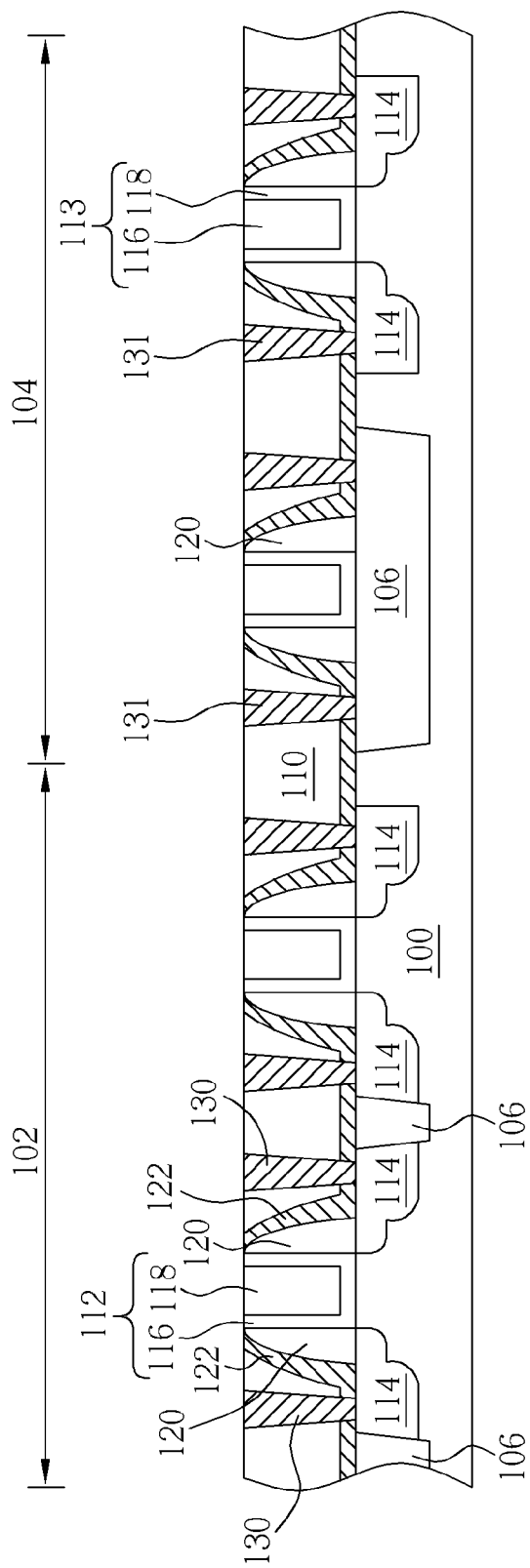
FIGS. 6-7 are schematic diagrams illustrating a thin film resistor structure according to a second preferred embodiment of the present invention.
Figure 7:
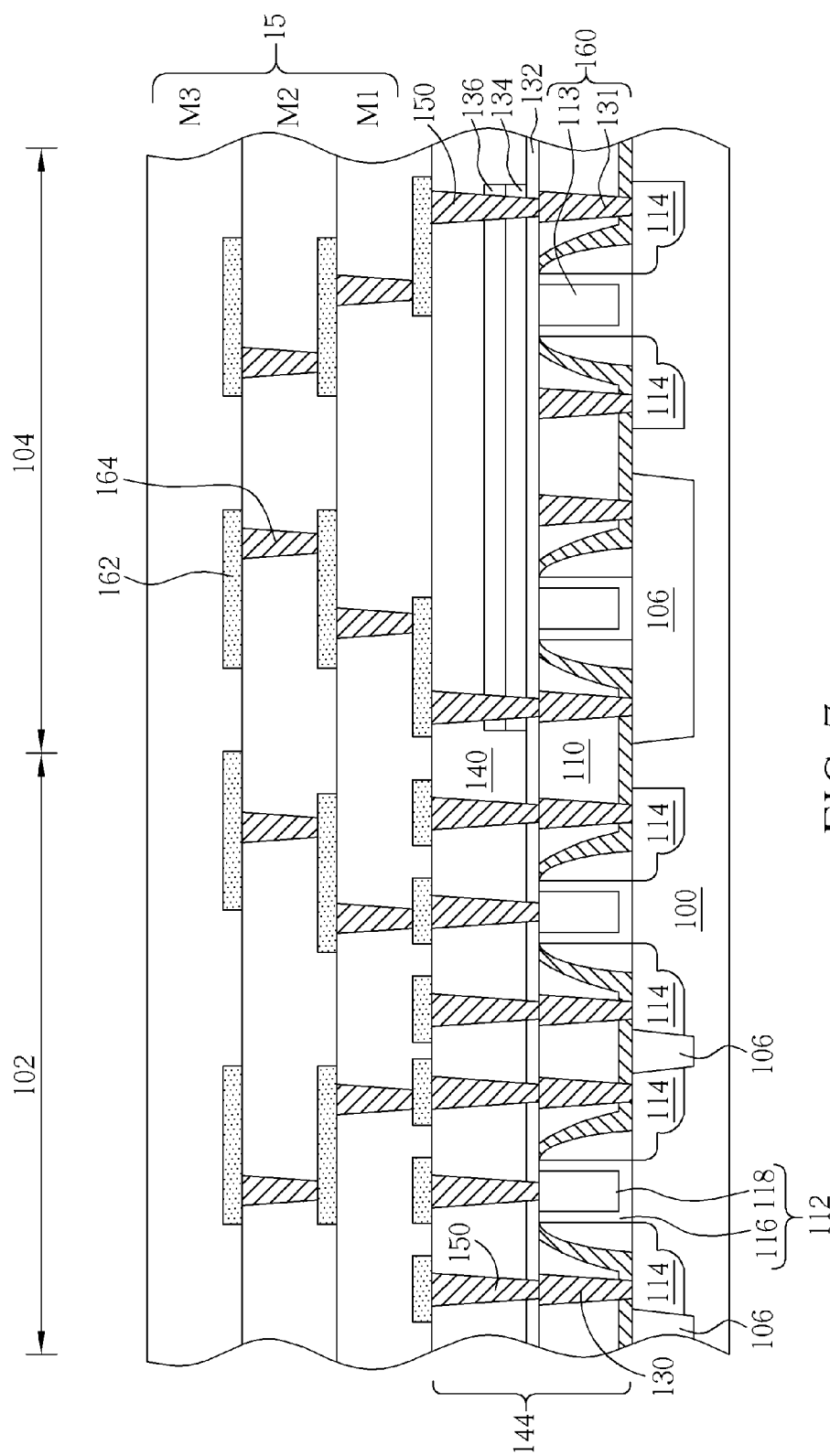

Please refer to FIGS. 6-7, FIGS. 6-7 are schematic diagrams illustrating a thin film resistor structure according to the second preferred embodiment of the present invention. As shown in FIG. 6, a substrate 100 is first provided, a semiconductor region 102 and a resistor region 104 are disposed on the substrate 100, and a plurality of STI (shallow trench isolation) 106 is then formed on the substrate 100 within the semiconductor region 102 and the resistor region 104. A bottom ILD (inter layer dielectric) 110 is entirely formed on the substrate 100, a plurality of metal gate structures 112/113 and a plurality of first contacts 130/131 are then formed in the bottom ILD 110.

As shown in FIG. 7, a second stop layer 132, a thin film resistor material layer (not shown) and a protective material layer (not shown) are formed on the bottom ILD 110 sequentially, the thin film resistor material layer and the protect material layer are simultaneously etched through a photo-etching process in order to form a thin film resistor layer 134 and a protect layer 136. Then, a flat top ILD 140 is formed on the second stop layer 132 that covers the protective layer 136 and the thin film resistor layer 134. A plurality of second contacts 150 is then formed in the top ILD 140. After the top ILD 140 and the bottom ILD 110 are formed, an interconnection layer may be formed on the dielectric layer 144, such as an IMD (inter metal dielectric) 159, and the IMD 159 further comprises at least a metal trace 162 and a via plug 164 adapted to electrically connect the thin film resistor structure to other semiconductor elements. The details of the manufacturing process and the material properties of the components in the second preferred embodiment are similar to the first preferred embodiment of the present invention mentioned above and will not be redundantly described.

It is worth noting that the difference between the second preferred embodiment and the first preferred embodiment is that in the latter one, each metal gate and the first contacts are not only within the semiconductor region 102, but also within the resistor region 104. The metal gate structure 113 or the first contacts 131 within the resistor region 104 are used as a supporting material 160. In other words, the supporting material 160 comprises the supporting metal gate 113 or the first contact 131 located in the resistor region 104. And the metal gate structure 113 or the first contact 131 may be a floating structure electrically isolated from other elements. The supporting material 160 is right under the thin film resistor 134 and serves as a support pillar that avoids dishing effects caused during the performing of the CMP on a large area of the bottom ILD 110 in the gate replacement process and the contact plug process. The second stop layer 132 and the thin film resistor layer 134 may be influenced by the dishing too. Since the supporting material 160 and the metal gate structure 112 or the first contacts 130 are formed simultaneously, there is no additional cost in this embodiment.

Figure 8:
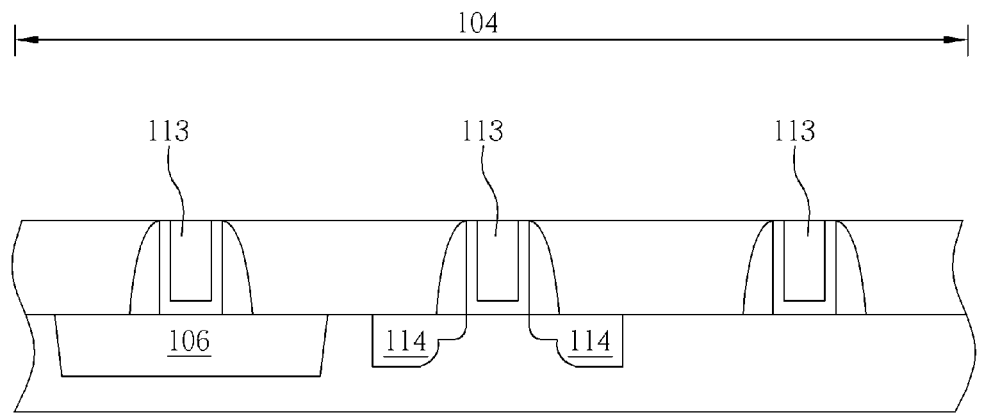
FIG. 8 is a schematic diagram illustrating three different types according to the second preferred embodiment of the present invention.
Figure 9:
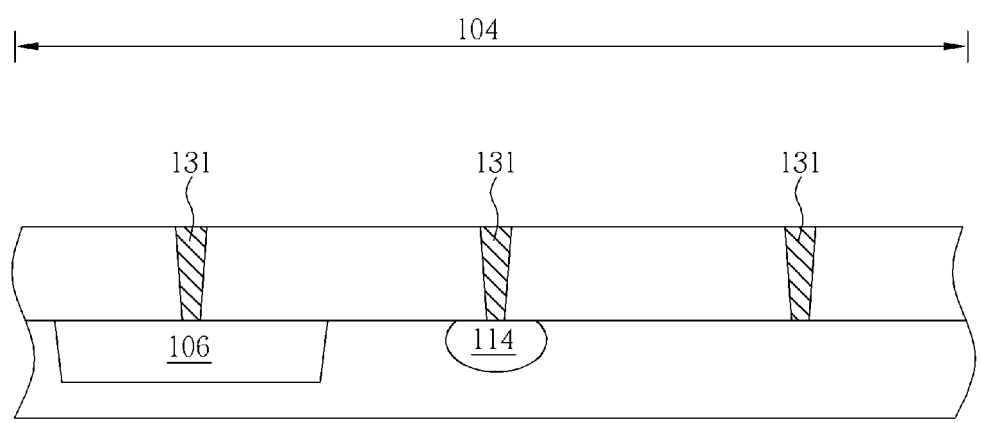
FIG. 9 is a schematic diagram illustrating another three different types according to the second preferred embodiment of the present invention.

It is worth noting that the supporting material 160 comprises all the elements disposed under the thin film resistor 160 and in the bottom ILD 110. The supporting material 160 includes the metal gate structure 113, the first contact 131 and even the dummy gate formed before the metal gate structure 113. All of these may be the supporting material 160. Besides, a surface of the supporting material substantially contacts the second stop layer 132 or the second contact 150, and a bottom surface of the supporting material substantially contacts the substrate 100, the STI 106 or the doping region 114 according to the situation. As shown in FIG. 8 and FIG. 9, FIG. 8 illustrates three different supporting material types of the second preferred embodiment, particularly related to the use of the metal gate structure 113 as the supporting material 160, the metal gate structure 113 may be located on three different places of the substrate 100. The metal gate structure 113 is a floating structure, which is not electrically connected to other elements in the thin film resistor structure, so it is isolated in the thin film resistor structure and won't be influenced by other elements. FIG. 9 illustrates three other different supporting material types of the second embodiment, particularly related to the first contact 131 being used as the supporting material 160, the first contact 131 may be located on three different places of the substrate 100. Similarly, the first contact 131 is a floating structure and is isolated in the thin film resistor structure. Besides, as shown in FIG. 7, the metal gate structure 113 and the first contact 131 may be used as the supporting material 160 together, and all of these embodiments can reach the goal of avoiding the dishing.

Figure 10:
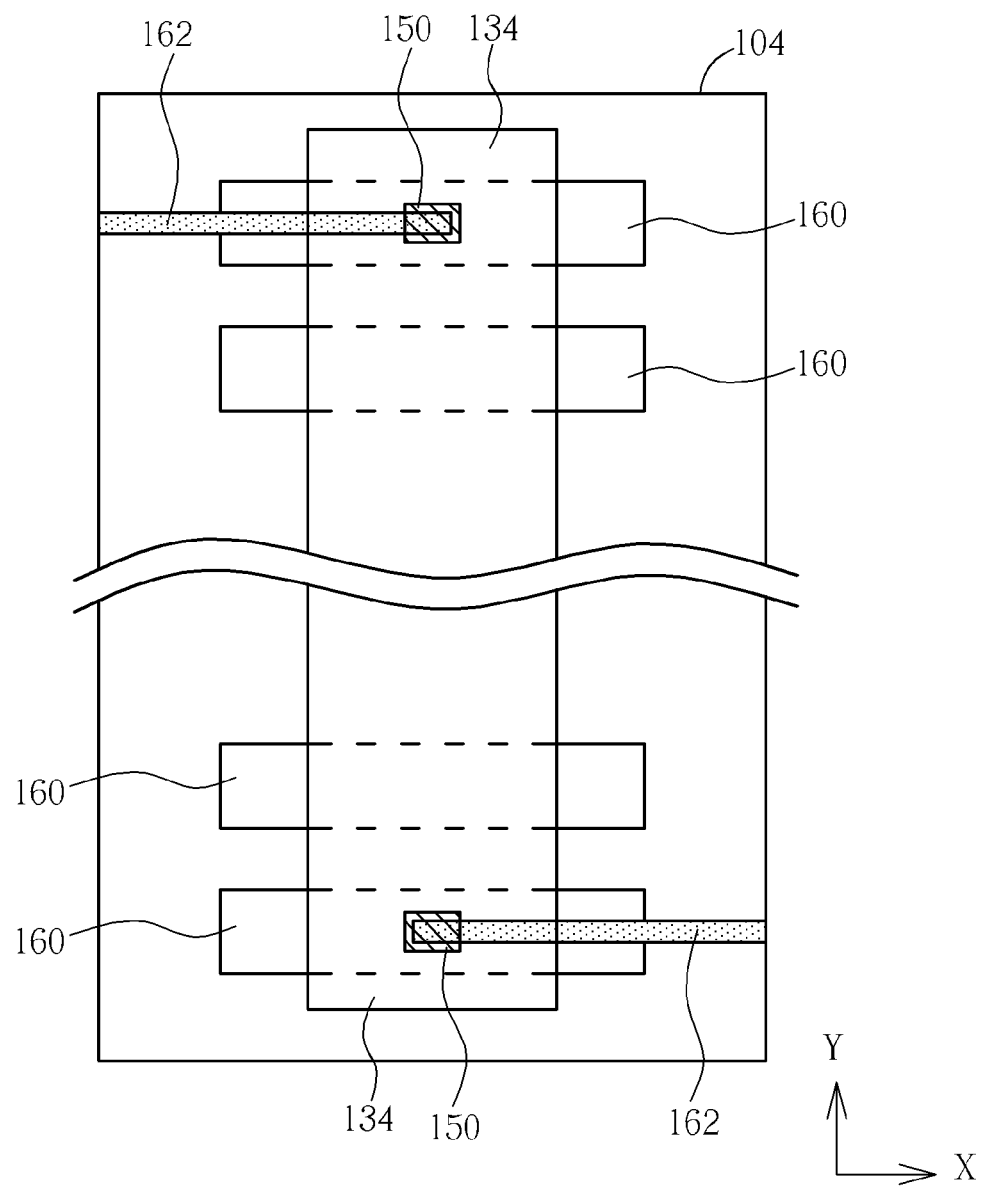
FIG. 10 is a top-view schematic diagram according to the second preferred embodiment of the present invention.

Besides, FIG. 10 illustrates the top-view schematic diagram according to the second preferred embodiment of the present invention. Each supporting material 160 extends along a first direction (i.e. X-axis), and each thin film resistor layer 134 extends along a second direction (i.e. Y-axis), and the second contact 150 is disposed on parts of the thin film resistor layer 134, each of the metal traces 162 is disposed on the second contact 150 and is electrically connected to the second contact 150. It is worth noting that the first direction and the second direction are not limited to X-axis and Y-axis, they may be any two other different directions, that are preferably orthogonal to each other in order to obtain better supporting performances.

To summarize the above descriptions, the invention provides a thin film resistor structure having a thin film resistor disposed between two flat ILD (inter layer dielectric). The structure can be integrated with a high-k metal gate process, and doesn't need complicated additional processes. Besides, another embodiment of the present invention provides a plurality of supporting materials disposed under the thin film resistor within the bottom ILD to avoid dishing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thin film resistor structure, comprising:
   a substrate;
   a flat bottom ILD (inter layer dielectric) disposed on the substrate;
   a plurality of first contacts disposed in the bottom ILD, and each top surface of the first contacts is on the same level as a top surface of the bottom ILD;
   a flat top ILD disposed on the bottom ILD;
   a plurality of second contact disposed in the top ILD, and each top surface of the second contacts is on the same level as a top surface of the top ILD;
   a thin film resistor disposed between the bottom ILD and the top ILD;
   a stop layer disposed between the bottom ILD and the top ILD, the thin film resistor being disposed on the stop layer; and
   at least one second contact penetrating through the thin film resistor and touching the surface of the stop layer.

2. The thin film resistor structure of claim 1, further comprising a protective layer disposed on the thin film resistor, wherein the area of the protect layer is the same as the area of the thin film resistor, and each sidewall of the protective layer is trimmed with each sidewall of the thin film resistor layer.

3. The thin film resistor structure of claim 1, wherein the substrate further comprises a semiconductor region and a resistor region, and the thin film resistor is disposed in the resistor region.

4. The thin film resistor structure of claim 3, further comprising at least one shallow trench isolation (STI) in the substrate within the resistor region.

5. The thin film resistor structure of claim 3, wherein the semiconductor region further comprises at least one metal gate and at least one first contact.

6. The thin film resistor structure of claim 5, wherein a top surface of the metal gate is on the same level as a top surface of the bottom ILD.

7. The thin film resistor structure of claim 5, wherein the first contact comprises a slot contact.

8. The thin film resistor structure of claim 1, further comprising at least an IMD (intermetal layer) disposed on the bottom ILD, and at least a metal trace and a via plug in the IMD.

9. A thin film resistor structure, comprising:
   a substrate;
   a flat bottom ILD (inter layer dielectric) disposed on the substrate;
   a plurality of first contacts disposed in the bottom ILD, and each top surface of the first contacts is on the same level as a top surface of the bottom ILD;
   a flat top ILD disposed on the bottom ILD;
   a plurality of second contacts disposed in the top ILD, and each top surface of the second contacts is on the same level as a top surface of the top ILD;
   a thin film resistor disposed between the bottom ILD and the top ILD;
   a stop layer disposed between the bottom ILD and the top ILD, the thin film resistor being disposed on the stop layer;

at least one second contact penetrating through the thin film resistor and touching the surface of the stop layer; and at least a first contact disposed under the thin film resistor within the bottom ILD.

10. The thin film resistor structure of claim 9, wherein the substrate further comprising a semiconductor region and a resistor region, and the thin film resistor is disposed in the resistor region.

11. The thin film resistor structure of claim 10, wherein the substrate further comprises at least a shallow trench isolation (STI) within the resistor region and the support material is disposed on the STI.

12. The thin film resistor structure of claim 9, wherein the support material comprises at least a metal gate or at least a first contact.

13. The thin film resistor structure of claim 9, wherein the supporting material extends along a first direction, the thin film resistor extends along a second direction, and the first direction is different from the second direction.

14. The thin film resistor structure of claim 9, wherein the first direction and second direction are orthogonal.

15. The thin film resistor structure of claim 9, further comprising at least one metal gate structure disposed under the thin film resistor within the bottom ILD.

* * * * *